United States Patent [19]

Roger

[11] 4,261,002
[45] Apr. 7, 1981

[54] MONOLITHIC COMPLEMENTARY DARLINGTON

[75] Inventor: Bernard Roger, Carpiquet, France

[73] Assignee: U.S. Philips Corporation, New York, N.Y.

[21] Appl. No.: 960,426

[22] Filed: Nov. 13, 1978

[30] Foreign Application Priority Data

Nov. 14, 1977 [FR] France ................................. 77 34126

[51] Int. Cl.³ .......................................... H01L 27/04
[52] U.S. Cl. ....................................... 357/46; 357/44; 357/86; 357/89
[58] Field of Search ....................... 357/44, 46, 50, 55, 357/56, 86, 89

[56] References Cited

U.S. PATENT DOCUMENTS

| | | | |
|---|---|---|---|
| 3,412,295 | 11/1968 | Grebene | 357/44 |
| 3,449,643 | 6/1969 | Imaizumi | 357/44 |
| 3,909,318 | 9/1975 | Le Can et al. | 357/50 |
| 3,930,909 | 1/1976 | Schmitz et al. | 357/44 |
| 3,998,674 | 12/1976 | Cameron et al. | 357/50 |
| 4,058,825 | 11/1977 | Bonis et al. | 357/44 |

FOREIGN PATENT DOCUMENTS 2376515  7/1978  France ....................................... 357/46

Primary Examiner—William D. Larkins
Attorney, Agent, or Firm—Thomas A. Briody; Robert T. Mayer; Steven R. Biren

[57] ABSTRACT

A semiconductor device includes at least one pair of complementary vertical bipolar transistors formed on a plate having a substrate formed of two adjacent portions of opposite conductivity type forming a p-n junction therebetween. The two adjacent portions form, respectively, the collector region of a first of the transistors and the emitter region of a second of the transistors. An electrode is provided on the lower face of the substrate to connect together the two adjacent portions of the substrate. The invention is particularly applicable to mixed Darlington amplifier structures and push-pull amplifiers composed of such structures.

12 Claims, 27 Drawing Figures

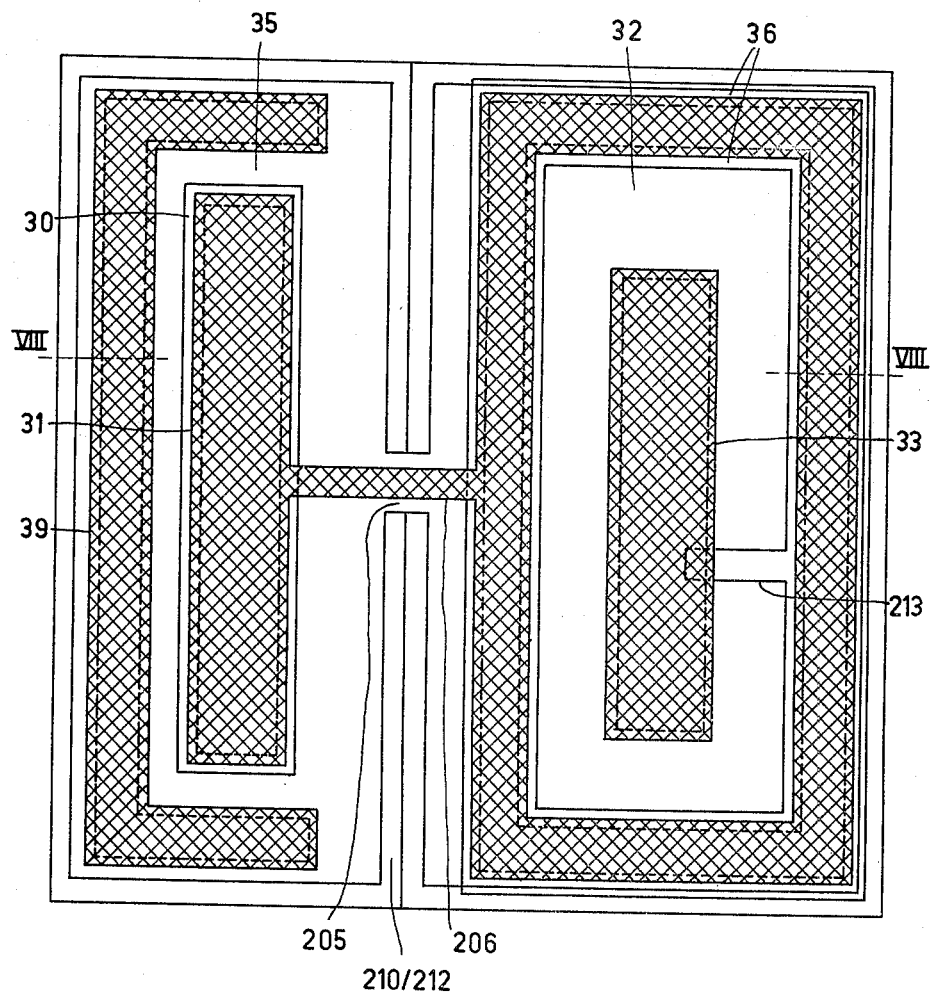

MONOLITHIC COMPLEMENTARY DARLINGTON

BACKGROUND OF THE INVENTION

The present invention relates to a semiconductor device comprising a semiconductor body having at least a first and a second bipolar complementary vertical transistor, each transistor comprising a base region and two external regions serving as emitter and collector regions, the said body being constituted by a substrate covered by a first epitaxial layer of a first conductivity type on which extends a second epitaxial layer of the second conductivity type opposite to the first, the base region of the first transistor and at least a part of an external region of the second transistor being formed by coplanar portions of the first epitaxial layer, the base region of the second transistor and an external region of the first transistor being formed by coplanar portions of the second epitaxial layer and a portion of the substrate constituting at least a part of the collector region of one of the transistors, an insulating barrier separating at least a part of the said portions of the second epitaxial layer entirely from each other.

For various applications, in particular in power amplification, it is desired to obtain monolithic semiconductor devices in which at least two complementary active elements are integrated, for example, two transistors of which the corresponding regions are of opposite types; this is the case in amplifier devices of the so-called mixed Darlington type comprising an input or control transistor, for example of the pnp-type, of which the collector controls the base of an output or power transistor, the emitter of the input transistor being connected to the collector of the output transistor.

The two transistors may be integrated in a substrate plate by means of known methods of epitaxial deposition and diffusion. An example of a structure thus obtained has been described in a French patent application published under No. 2,297,495. This structure offers considerable advantages, in particular with regard to gain, and flatness of the active face, which permits good ohmic surface connections. However, the connection between the emitter of the input transistor and the collector of the output transistor of the Darlington assembly described in said Patent Application necessitates a metallic connection reaching the bottom of a mesa groove, which in certain cases may present difficulties. In addition, the connection between the collector of the input transistor and the base of the output transistor is an internal connection realized by the continuity between these two regions in the same epitaxial layer, which necessitates a highly doped localized buried layer. In spite of said buried layer, the resistance of this connection may still be too high in certain applications. Moreover, the very high doping of said layer involves difficulties in epitaxy due to the migration towards the epitaxial layers of impurities from the highly doped layer.

SUMMARY OF THE INVENTION

One of the objects of the invention is to improve the possibilities of the known devices, such as the Darlington devices mentioned above, and to provide for assemblies of two complementary transistors a structure permitting simpler electrical connections which are of low resistance and are reliable.

According to the present invention, a semiconductor device comprising a semiconductor body having at least first and second bipolar complementary vertical transistors, each transistors comprising a base region and two external regions serving as emitter and collector regions, the said body being constituted by a substrate covered by a first epitaxial layer of a first conductivity type on which extends a second epitaxial layer of the second conductivity type opposite to the first, the base region of the first transistor and at least a part of an external region of the second transistor being formed by coplanar portions of the first epitaxial layer, the base region of the second transistor and an external region of the first transistor being formed by coplanar portions of the second epitaxial layer and a portion of the substrate constituting at least a part of the collector region of one of the transistors, an insulating barrier entirely separating at least a part of the said portions from the second epitaxial layer, is characterized in that at least a part of the collector region of one of the said first and second transistors and at least a part of the emitter region of the other transistor are constituted by two adjoining and coplanar portions of the substrate of opposite conductivity types forming a p-n junction, that the insulating barrier extends from the upper face at least down to the substrate and that the said p-n junction constitutes at least a part of a p-n junction which extends from the lower face of the substrate up to the said insulating barrier.

In device acoording to the present invention, the connections of the transistors of the complementary assembly are realized by conductive layers deposited on the surfaces of the device; they may thus be of a resistance which is as low as may be desired.

An electrical connection between the two external regions formed in adjoining portions of the substrate (the emitter of one of the transistors and the collector of the other) is very simply obtained by means of a conductive electrode, for example metallic electrode, extending in the lower face of the substrate.

The upper face (or active face) of the device which is the upper face of the second epitaxial layer also has good flatness, which permits electric connections of good quality, for example by means of localized metallic deposits. Due to the flat surfaces, the connections are reliable. They are easy to realize. Moreover, their deposit at the end of the manufacturing process does not involve any disturbance in the device.

In a first embodiment of the assembly of complementary transistors according to the invention the regions in the substrate are the emitter of the first transistor and a first zone of the collector of the second transistor, while the base of the first transistor and a second zone of the collector of the second transistor are constituted by portions of the first epitaxial layer, and the collector of the first transistor and the base of the second transistor are constituted by portions of the second epitaxial layer, the emitter of the second transistor being constituted by a doped zone of a first conductivity type included in the second epitaxial layer, the base contact of the first transistor being constituted by a doped zone of the first conductivity type which extends from the upper face down to a depth exceeding that of the second epitaxial layer. Contact regions of the collector of the first transistor and of the base contact of the second transistor are constituted, if desired, by doped zones of the second conductivity type formed in the second epitaxial layer. These regions are constituted generally by diffused or implanted zones. In this embodiment the collector of the first transistor (the one in which the base in the first epitaxial layer is of the first conductivity type) may be easily connected to the base of the second transistor (the one in which the base is in the second epitaxial layer of the second conductivity type). It follows that the invention in this embodiment is directly applicable to obtaining a mixed Darlington device.

In the application of said first embodiment to a mixed Darlington arrangement, the input transistor of the amplifier is the first transistor and the output transistor is the second transistor, the collector of the first transistor being connected to the base of the second transistor, an electrode connected to the base of the first transistor constituting the input of the amplifier and the two regions formed in the substrate being short-circuited by an electrode extending on the lower face of the substrate and constituting the output.

In a second embodiment of the assembly of complementary transistors according to the invention, the collector of the first transistor and a first zone of the emitter of the second transistor are the regions formed in the substrate while the base of the first transistor and a second zone of the emitter of the second transistor are constituted by portions of the first epitaxial layer, and the emitter of the first transistor and the base of the second transistor are constituted by portions of the second epitaxial layer, the collector region of the second transistor being constituted by a doped zone of the first conductivity type included in the said second epitaxial layer and a base contact region of the first transistor being constituted by a zone of the first conductivity type, preferably highly doped, which extends from the upper face down to a depth exceeding the depth of the second epitaxial layer. A base contact region of the second transistor and an emitter contact region of the first transistor are constituted by doped zones of the second conductivity type formed in the second epitaxial layer. These zones may also be diffused or implanted.

In this embodiment of the complementary assembly, it is the second transistor (the one in which the base, in the second epitaxial layer, is of the second conductivity type) of which the collector can be easily connected to the base in the complementary transistor, the first transistor (the one in which the base is in the first epitaxial layer of the first conductivity type) and may notably serve thus as an input transistor of a mixed Darlington arrangement in which the output transistor is the first transistor.

In the application of this second embodiment to a mixed Darlington arrangement, the input transistor of the amplifier is the second transistor and the output transistor is the first transistor, the collector of the second transistor being connected to the base of the first transistor, an electrode connected to the base of the said second transistor constituting the input of the amplifier and the two regions formed in the substrate being connected together by an electrode extending on the lower face of the substrate and constituting the output.

It will be apparent that a Darlington arrangement of the "second embodiment" realized on the same plate as a Darlington arrangement of the "first embodiment" is of the type opposite to and complementary to the type of the former.

Hence assemblies of opposite and complementary types of two complementary transistors may be obtained on the same plate, in particular mixed npn/pnp and pnp/npn Darlington arrangements.

In an advantageous embodiment of amplifier devices, two complementary assemblies of complementary transistors, one of the first embodiment, the other of the second embodiment, each constituting a mixed Darlington arrangement, are combined on the same plate to constitute an amplifier of the so-called symmetrical push-pull type.

This device comprising in the same semiconductor body a first mixed Darlington arrangement constituted by a first assembly of the "first embodiment" and a second mixed Darlington assembly constituted by a second assembly of the "second embodiment" is notably characterized in that the two portions of the substrate, the two portions of the first epitaxial layer and the two portions of the second epitaxial layer used for the first assembly are respectively coplanar to the two portions of the substrate, to the two portions of the first epitaxial layer and to the two portions of the second epitaxial layer used for the second assembly, that the regions of the transistors of the first assembly formed in the two said epitaxial layers are separated from the regions of the transistors of the second assembly formed in the two said layers by an insulating barrier extending from the upper face down to a depth exceeding the thickness of the two said epitaxial layers, that the said four portions of the substrate are short-circuited by a conductive electrode on the lower face of the substrate, and that said two Darlington arrangements constitute an amplifier of the so-called push-pull type, of which the inputs are the base of the first transistor of the first assembly and the base of the second transistor of the said second assembly and of which the output is the electrode situated on the lower face of the substrate.

The advantages of this device are numerous. First, it has the advantages of the Darlingtons which compose it: low resistance of the connections, reliability, and ease in manufacture. Moreover, it is particularly advantageous in that it permits putting the metallic electrode, placed on the lower face of the substrate, at the zero or the high voltage, which is convenient; said electrode is connected to the dissipator and to the envelope and the user cannot touch the high voltage, which improves the safety. Moreover, since the device is at the same temperature, supplementary circuitry is not necessary to improve the temperature stability, as is necessary for discrete elements.

The different zones and regions of the devices according to the invention are made of material doped in accordance with the performance requirements. Of course the emitters, the contact zones or conduction zones are preferably highly doped, while the bases and collectors comprise low-doped zones in such manner as to obtain the best characteristics, in particular the breakdown voltages desired for the device.

The electric connection between the emitter of the first transistor and the collector of the second transistor according to the first embodiment, and the electric connection between the emitter of the second transistor and the collector of the first transistor according to the second embodiment (emitter of the input transistor and collector of the output transistor in the two cases of application to a mixed Darlington arrangement) obtained very simply, for example, by means of a metallic electrode extending on the lower face of the substrate, is realized when, by soldering, the substrate is made to form one assembly with a metallic support serving at the same time as a thermal dissipator. The connection thus made is of low resistance and very reliable.

The insulating barrier, notably in an application to a Darlington arrangement, separating both the base of the first transistor at the level of the first layer and the base of the second transistor from an external region of the first transistor at the level of the second layer, and the barrier separating, in the application to a so-called push-pull amplifier having two complementary Darlington arrangements, the first Darlington arrangement from the second Darlington arrangement, are advantageously constituted by grooves which are recessed from the surface of the second epitaxial layer into the substrate and which may be filled with an insulating material or only be covered by a passivating insulating material, for example an oxide.

Such an insulating barrier could equally be realized by localized oxidation and, if desired, by means of an implantation of ions, for example nitrogen.

If the formation of the insulating barrier involves an imperfectness in flatness on the active surface, a flat or flatter surface may be arranged for the crossings of said difference in level with conductive films connections which form the connection between an electrode of the first transistor and an electrode of the second transistor while forming in said barrier an interruption or a discontinuity which forms a passage.

If the barrier is obtained from a groove, it is sufficient to leave the flat plate in the place where it is desired to form said connection; the said passage is constituted by the semiconductor material thus left in place.

The advantages of reliability given to the conduction path by the fact that the layer which realizes it is flat, turn the interruption of the barrier into a solution which may be considered as preferential.

In a first configuration, the bottom adjoining the substrate in at least a part of the said insulating barrier is bounded on one side by a portion of the substrate of the first conductivity type and on the other side by a portion of the substrate of the second conductivity type and the said p-n junction situated between said adjoining portions of the substrate terminate directly on the said insulating barrier.

In a second configuration the insulating barrier separating in the first epitaxial layer of the first conductivity type a first portion constituting the base of a transistor of a first type, from a second portion constituting a zone of an external region of a transistor complementary to the first, contacts the said substrate solely in the portion of same which is of the second conductivity type, and the said portion of the substrate projecting from the said barrier constitutes a p-n junction with the adjacent extremity of the said second portion of the first epitaxial layer. This junction which terminates at one of its extremities on the said insulating barrier rejoins at the other extremity the p-n junction situated between the two portions of opposite types of the substrate with which it constitutes a p-n junction extending from the lower surface of the substrate up to the said insulating barrier.

This double possibility permits a large tolerance in the manufacturing process, and thus offers great flexibility.

The method of manufacturing a device according to the invention may be carried out by means of known methods, as follows.

In a plate of a good crystal quality of a first conductivity type, impurities giving the conductivity type opposite to the first are introduced locally at least in a certain thickness of the substrate in a concentration higher than that of the said plate; in order to obtain therein portions of the conductivity types opposite to the first, a first epitaxial layer which is low-doped is then deposited on one of the large faces of the said plate on which portions of the two conductivity types will grow, then a second lowdoped epitaxial layer of the conductivity type opposite to that of the said first epitaxial layer is deposited on same; then localized regions are formed of which at least two of the conductivity type of the first epitaxial layer, one of a depth larger than the thickness of the second epitaxial layer being destined to constitute the base contact of the first transistor, the other, destined to form an external zone of the second transistor, being included in the second epitaxial layer; then insulating barrier is provided and the contacts and connections are made.

The manufacture of the device, which may be carried out principally by means of known techniques, is thus quite reliable.

During the introduction in the substrate plate of impurities destined to create therein portions of the conductivity type opposite to the first type, the said impurities may be introduced in the whole thickness of the plate of which the assembly hence constitutes the substrate, which is particularly simple.

The depth of the impurities which are introduced from one of the faces of the said plate may also be limited to a value lower than the thickness thereof, leaving on the side of the face opposite to the introduction face a layer of the first conductivity type which is removed afterwards. This permits reducing the introduction time of the impurities and simultaneously having a thick and resistant plate during handling.

According to a first embodiment of the method, the localized introduction of a high impurity concentration giving the conductivity type opposite to at least a portion of a plate of a first conductivity type is carried out by displacement of a fusion zone in a temperature gradient, which method is often referred to as thermomigration.

The plate being of silicon and the conductivity N or N+ (the plus sign indicating a high doping), highly doped p+ type parts of the substrate are obtained by thermomigration of aluminium.

It would also be possible to start from a p+ type substrate and realize therein N+ zones, notably by thermomigration of gold-antimony.

The method by thermomigration is rapid, comprises few operations and it is hence economical.

According to a second embodiment of the method, the localized introduction of high concentration of impurities giving the conductivity type opposite to at least a portion of a plate of a first conductivity type is carried out by diffusion, for example, starting from a pre-diffusion deposit.

P+ portions can be obtained, for example, in a silicon plate of the N+ type by diffusion of aluminium or boron, or N+ portions can be obtained in a plate of P+ silicon by diffusing phosphorus.

This mode of operation uses well-known methods. It is thus immediately realizable.

The invention is applicable in particular to the realization of complementary transistor devices of the mixed Darlington type destined notably for amplifiers. Arrangements of two assemblies of complementary transistors each mounted in a mixed Darlington arrangement and forming a push-pull amplifier are advantageously realized with the structure according to the invention in a monolithic plate.

BRIEF DESCRIPTION OF THE DRAWING

The invention will now be described in greater detail, by way of example, with reference to the accompanying drawings, in which:

FIG. 9 is a plan view of the device shown in FIG. 8.

DETAILED DESCRIPTION

It is to be noted that, for clarity, the Figures are not drawn to scale, notably, the thickness dimensions being exaggerated.

Figure 1:
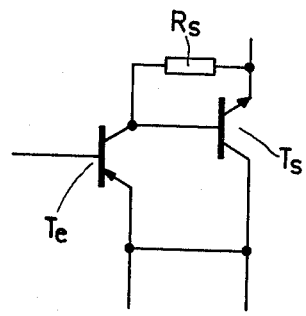
FIG. 1 is a diagram of a mixed Darlington arrangement having two complementary transistors.
Figure 2:
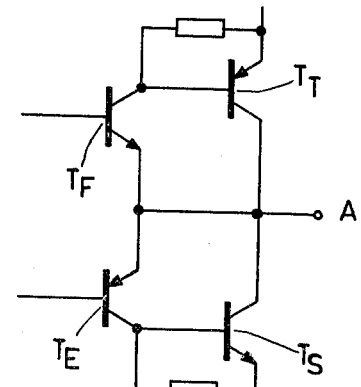
FIG. 2 is a diagram of a so-called push-pull amplifier comprising two complementary assemblies of two complementary transistors.

The circuits shown in FIGS. 1 and 2 are examples of circuits which can be realized in a device according to the invention.

The circuit shown in FIG. 1 is that of a mixed Darlington amplifier arrangement comprising two complementary transistors: an input transistor $T_e$ and an output transistor $T_s$. In the Figure the input transistor is a pnp transistor and the output transistor is an npn transistor. A mixed Darlington amplifier in which the input transistor is an npn transistor and the output transistor is a pnp transistor (complementary to the preceding one or of opposite type) is also possible. This type of circuit also comprises a resistor $R_S$ added parallel to the base-emitter junction of the output transistor so as to improve the transfer characteristics. In fact, said resistor receives a part of the leakage current from the input transistor which, for that reason, is not amplified in the output transistor.

The circuit shown in FIG. 2 is that of a so-called symmetrical push-pull amplifier comprising two complementary mixed Darlington arrangements. A first mixed Darlington is a pnp/npn composed of input and output transistors $T_E$ and $T_S$ and the second mixed Darlington arrangement complementary to the first is an npn/pnp composed of input and output transistors $T_F$ and $T_T$.

As in the first case, this circuit can be integrated in a monolithic plate in one of the embodiments of the present invention.

Figure 3:
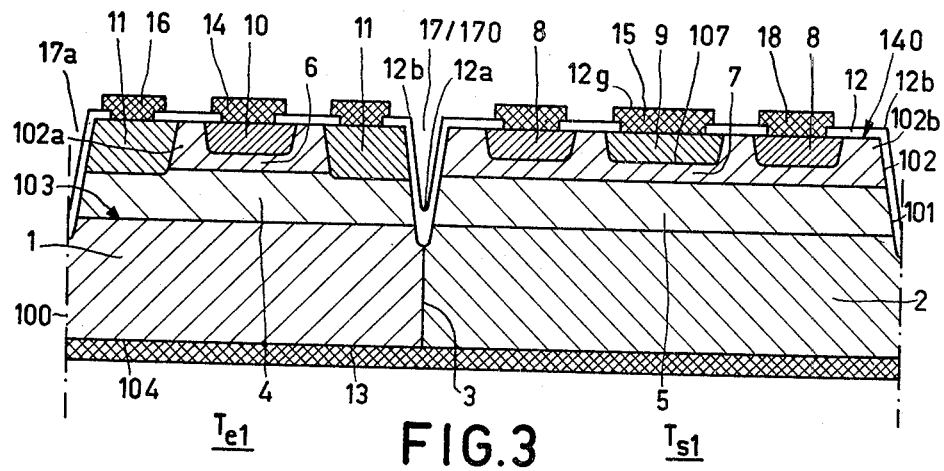
FIG. 3 is a diagrammatic sectional view taken on the line III—III of FIG. 4 of an assembly of two complementary transistors of the first embodiment and the first configuration.
Figure 5:
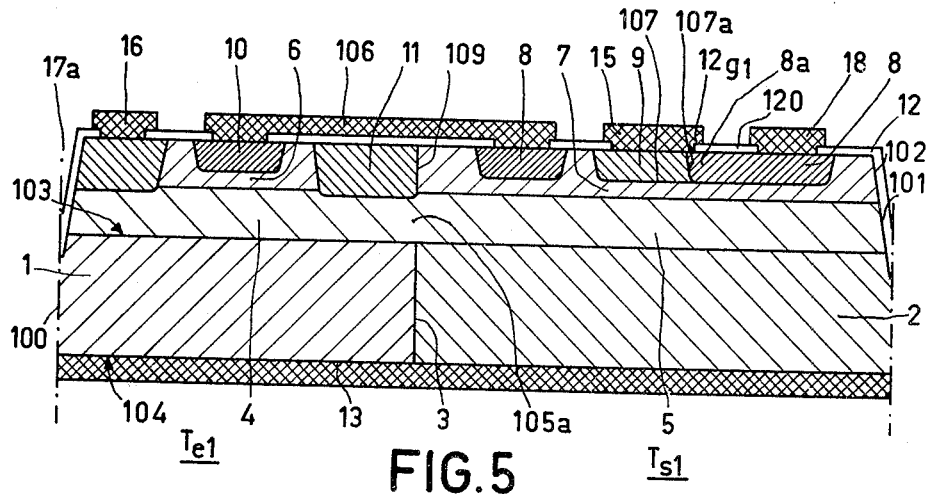
FIG. 5 is a second diagrammatic sectional view of the device shown in FIGS. 3 and 4 taken on the line V—V of FIG. 4 showing notably an interruption in the insulating barrier.
Figure 4:
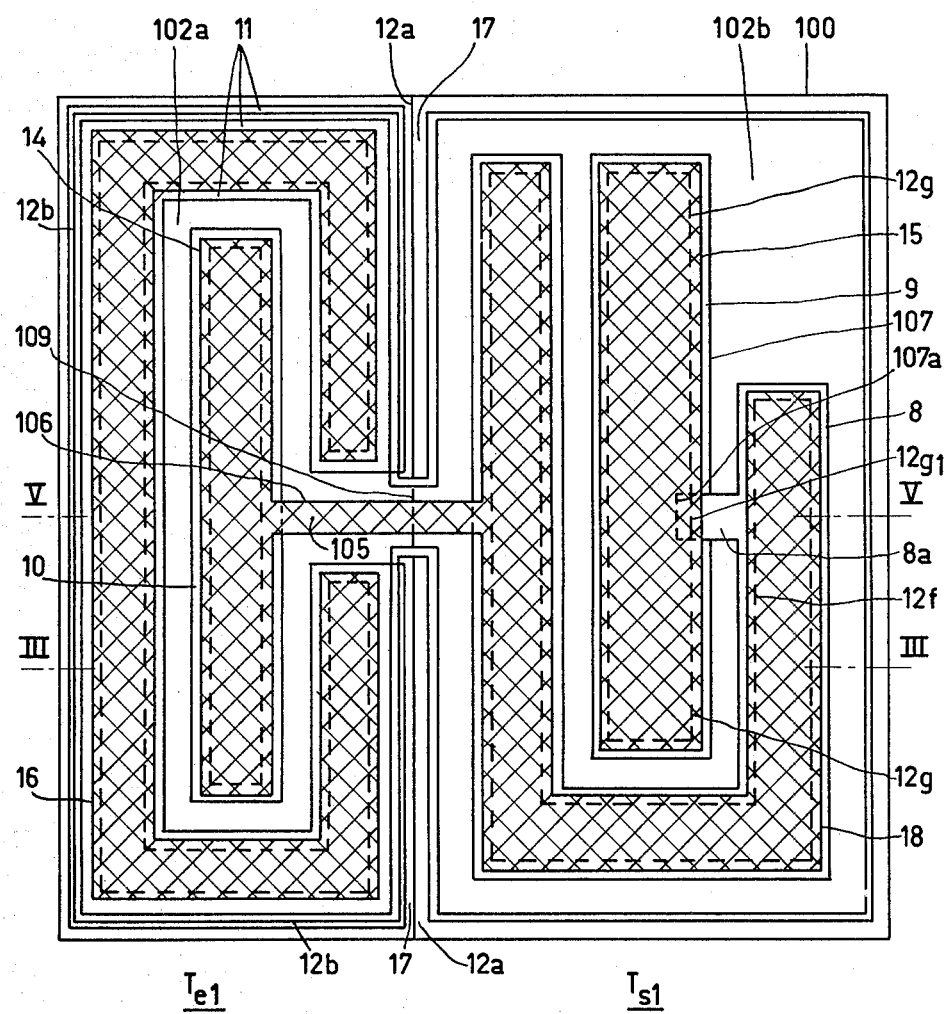
FIG. 4 is a plan view of the device shown in FIG. 3.

FIGS. 3, 4 and 5 show a semiconductor device of the first configuration and the first embodiment and comprising a semiconductor body having at least a first transistor $T_{e1}$ and a second transistor $T_{s1}$, the said transistors being vertical, bipolar and complementary.

The said body is constituted by a plane substrate referenced 100 and covered on its face 103 by a first epitaxial layer 101 of a first conductivity type on which extends a second epitaxial layer 102 of the second conductivity type opposite to the first; the base region 4 of the first transistor $T_{e1}$ and a part of the collector 5 of the second transistor $T_{s1}$ are formed by two coplanar portions of the first epitaxial layer. The base region 7 of the second transistor and the collector 6 of the first transistor are formed by coplanar portions of the second epitaxial layer. The portion 2 (of the first conductivity type) of the substrate which constitutes another part of the collector region of the second transistor adjoins the portion 1 of the second conductivity type of the said substrate which constitutes the emitter of the first transistor.

These two portions 1 and 2 of the substrate 100 are separated by a junction 3 which, owing to the fact that the device of FIGS. 3, 4 and 5 is of the first configuration, extends from the lower face 104 of the substrate at the bottom of an insulating barrier 170 sunk from the upper and active face 140 of the device via the layers 102 and 101 and the surface 103 of the substrate down to the interior thereof.

The emitter 9 of the second transistor is constituted by a doped zone of the first conductivity type included in the second epitaxial layer and the base contact 11 of the first transistor is constituted by a doped zone of the same first conductivity type extending from the upper face 140 down to a depth exceeding that of the second epitaxial layer.

For this first example the first transistor $T_{e1}$ is a pnp transistor and the second transistor $T_{s1}$ is an npn transistor, the portion 1 of the substrate being of the P type doped with aluminum in a concentration of $5.10^{19}$ atoms/cm$^3$ and the portion 2 being of the N type doped with antimony in a concentration of $5.10^{18}$ atoms/cm$^3$.

The first epitaxial layer 101 is of the N conductivity type as is the substrate portion 2 but lightly doped (for example $10^{15}$ atoms/cm$^3$) giving a resistivity of 3Ω cm.

The second epitaxial layer 102 is of the P type and is also lightly doped (for example $3.10^{15}$ atoms/cm$^3$).

The insulating groove 17 separates in the layer 101 the base 4 of the first transistor from the collector 5 of the second transistor and in the layer 102 separates the portions 102a of which the greater part constitutes the collector 6 of the first transistor from a portion 102b of which the greater part constitutes the base 7 of the second transistor.

In FIG. 3 the bottom of the said groove 17 is bounded on one side by the portion 1 of the substrate and on the other side by the portion 2 of the same substrate, the junction 3 extending directly according to the first configuration from the lower face 104 of the substrate opposite to the face 103 up to the bottom of the said groove 17.

Said groove 17 contains an interruption 105 forming the passage supporting a flat metallic connection layer 106 of one transistor to the other.

In FIGS. 3, 4 and 5, the mesas created on the edges of said integrated circuit at the same time with the insulating groove 17, are denoted by 17a.

A shallow zone 10 which is highly doped and of the P+ type diffused in the portion $102_a$ serves to reduce the resistance of the collector 6 of the first transistor. A highly doped N+ type zone 11 is also diffused in the portion $102_a$ and, via same, down to a depth which is sufficient for it to reach the base 4 of the first transistor and to ensure the contact on same. Said zone is preferably given the shape of a crown, ring, torus or belt and, more generally of a volume homeomorphous to said volumes, surrounding the collector 6. It is to be noted that in topology two Figures are homeomorphous when each may be the transform of the other by continuous deformation as is said, for example, in the book entitled by Topology by E. M. PATTERSON, page 2, notably lines 9 to 16.

A shallow, highly doped N+ type zone 9 diffused in the portion $102_b$ constitutes the emitter of the second transistor. A shallow highly doped P+ type zone 8 also diffused in the portion $102_b$ serves to improve the contact on the base 7 of the second transistor. Advantageously said zone is given the shape of a hook which partially surrounds the emitter of the second transistor and a projection $8_a$ is formed on said hook and serves to realize the resistor $R_{s1}$ as will be explained hereinafter. The emitter-base junction of the second transistor is represented by the solid line 107 in FIG. 4.

The surface of the device is covered by an insulating oxide layer 12 in which contact apertures are recessed. $12_a$ denotes the plate of oxide at the bottom of the insulating groove 17, $12_b$ denotes the oxide lines situated at the edge of the insulating groove and at the edge of the mesas and $12_g$, denotes the edges of the oxide layer along the emitter contact aperture of the second transistor. These contours are shown in FIG. 4.

The contacts are made by means of metallic films at 16 for the base and at 14 for the collector of the first transistor, at 18 for the base and at 15 for the emitter of the second transistor.

It is to be noted in FIG. 4 that, although the zone 11 has a closed shape which is homeomorphous to a ring, that is not the case with the film 16 which comprises an aperture for leaving the passage for the conductive film 106 which connects the collector contact 14 of the first transistor to the base contact 18 of the second transistor, which contact is in the form of a hook of the zone 8.

A metallic deposit 13 on the lower face 104 of the substrate 100 ensures a short-circuit of the junction 3 between the portions 1 and 2 of the said substrate and at the same time ensures the contact on the emitter of the first transistor and on the collector of the second transistor. The deposit 13 constitutes a reliable electric connection of minimum resistance.

The groove 17 is interrupted by a passage 105. At the level of the first epitaxial layer 101, said interruption leaves a connection zone $105_a$ between the portions 4 and 5 of the layer 101. Since the device described in this example is of the first embodiment, the portion 4 is the base of the first transistor and the portion 5 is a part of the collector of the second transistor connected to the emitter 1 of the first transistor; thus said connection zone constitutes a parallel resistor on the emitter-base junction of the first transistor. In the case of the application to a Darlington arrangement, it derives a part of the control current of the input transistor resulting from preceding stages; for this reason, its presence reduces the gain of the input transistor.

However, this is not always a disadvantage: for example, in low-frequency use, a resistor is placed at the input which smoothes the small signals to avoid amplification of the noise; moreover, said resistor reacts upon the transistor which precedes and, by fixing its value in an adequate manner, it is possible to fix the mode and the operating range of said transistor. In all these cases, its presence is useful, it is sometimes desirable that it has the lowest possible value compatible with the gain of the assembly of transistors and, as far as one knows the preceding circuit, it may be integrated.

The choice of the first embodiment of the invention is particularly interesting in that the resistance of the passage is sometimes favourable.

Since the first epitaxial layer has been low-doped (its resistivity is, for example, $3\Omega$ cm) said connection zone is already sufficiently resistant in order that the gain of the transistor is little affected and, in as far as said resistance constitutes a parasitic resistance, it may be given a high value, for example, to ameliorate the commutation performances. Said high value may be obtained, for example, by giving the said connection zone an elongate shape or, more exactly, by making said connection zone to be succeeded by one or several elongate segments which in fact constitute series resistances. For this purpose is advantageously used the topology described in detail in the following example with reference to FIGS. 6 and 7. In order to increase said resistance, the interruption may also be replaced by a discontinuity notably by diminishing the depth of the groove, which constitutes a compromise solution.

At the level of the second epitaxial layer 102, the base 7 of the second transistor $T_{s1}$ and the collector 6 of the first transistor $T_{e1}$ are insulated by the base contact 11 of the first transistor $T_{e1}$, which contact has a shape which is homeomorphous to that of a ring, and by the junction 109.

The oxide layer 12 covers said passage 105 which supports the above-mentioned connection 106.

As described above, the base contact zone 8 of the transistor $T_{s1}$ (of which the exact contour on the interior of the base zone 7 is not shown in the Figure) presents a projection $8_a$ which extends below the area 120 of the layer 12 and on the other side of the edge $12_{g1}$ of said area directly below the metallic skin 15. The base emitter junction 107 of the second transistor thus has a curve $107_a$ in which it supports directly the metallic skin 15. Thus the resistor $R_{s1}$ is formed parallel to the base-emitter junction of the transistor $T_{s1}$. Said resistor separates the leakage current of the two transistors, it derives the leakage current of the input transistor and avoids that said current is amplified by the output transistor. The geometry of said resistor is given in the Figures only by way of indication. It may be adapted to the resistivity of the layer.

So one has a mixed Darlington arrangement which is particularly reliable as shown in the diagram of FIG. 1, in which the input transistor $T_{e1}$ has an emitter 1, a base 4, a collector 6, a base contact zone 11, a collector contact zone 10 and in which the power transistor $T_{s1}$ has a collector 5 and a collector conduction zone 2, a base 7 and a base contact zone 8 and finally an emitter 9. A resistor parallel to the base-emitter junction of the input transistor $T_{e1}$ is constituted by the part $105_a$ of the passage 105 which traverses the groove 17 and the resistor $R_{s1}$ parallel to the base-emitter junction of the output transistor $T_{s1}$ is constituted by the surface layer of the projection $8_a$ of the base contact zone which brings the part $107_a$ of the junction 107 directly below the emitter contact 15.

The connection which connects the collector of $T_{e1}$ to the base $T_{s1}$ is constituted by the film 106. The collection which connects the emitter of $T_{e1}$ to the collector of $T_{s1}$ is constituted by the layer 13. These connections are of a low resistivity, reliable and easy to realize.

Figure 6:
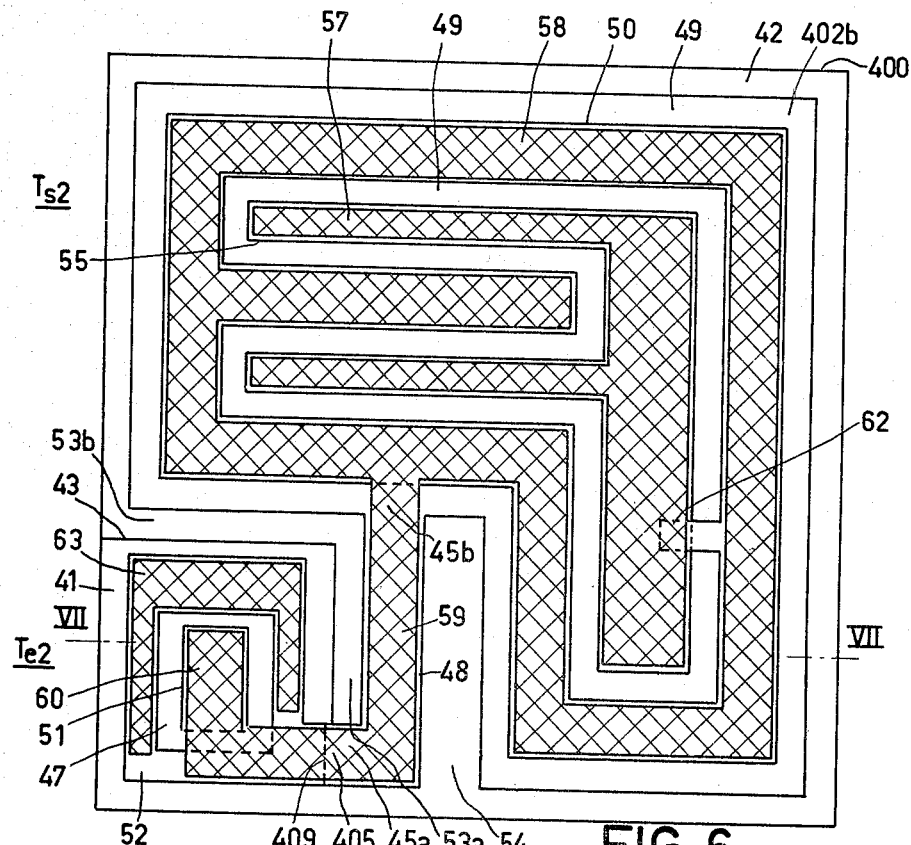
FIG. 6 is a plan view of a second topology of an assembly of two complementary transistors also of the first embodiment and the first configuration.
Figure 7:
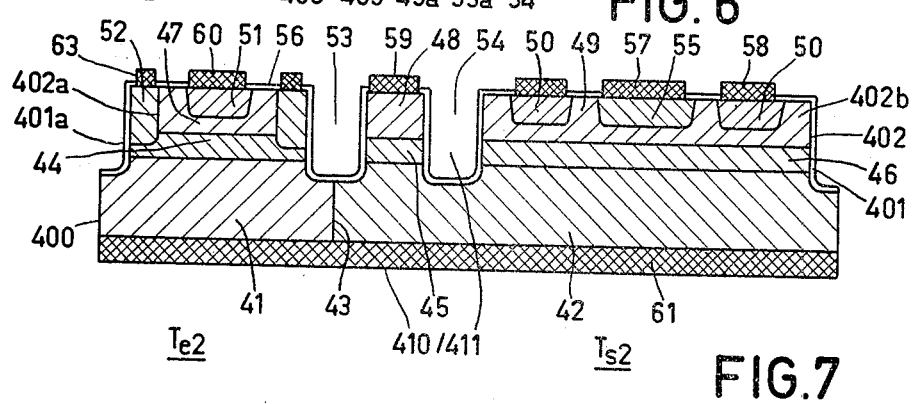
FIG. 7 is a diagrammatic sectional view taken on the line VII—VII of FIG. 6 of the device shown in FIG. 6.

This mixed Darlington arrangement may be realized in a topology approximately as shown in FIGS. 6 and 7 in which the input transistor is referenced $T_{e2}$ and the output transistor $T_{s2}$. 41 and 42 in these Figures are the coplanar portions of the substrate 400 which constitute the junction 43. The portion 41 of the smaller surface is of the P+ type; it constitutes the emitter of the input transistor $T_{e2}$; first transistor. The portion 42 is of the N+ type and constitutes a part of the collector of the output transistor $T_{s2}$, second transistor.

The two portions of the substrate are covered by an epitaxial layer 401 which is low-doped with the N type, covered itself by a second epitaxial layer 402 low-doped with P type.

The two superimposed epitaxial layers are separated from each other by an insulating barrier 411 constituted by a groove 410 recessed down to the substrate into which it slightly penetrates and which comprises two sections $53_a$ and $53_b$ perpendicular to each other and an additional barrier 54.

On its largest length the junction 43 follows the track of the sections $53_a$ and $53_b$, the portion 41 of the substrate underlying the portion $401_a$ of the layer 401 which constitutes the base 44 of the transistor $T_{e2}$. The portion 41 also underlies the portion $402_a$ of the layer 402 in which are diffused on the one hand a zone which is homeomorphous to a ring 52 highly doped with the N+ type reaching the portion of the underlying layer 44 and constituting the base contact, and on the other hand the zone 51 which is highly doped with the P+ type, less deep than the layer itself and which, with the remaining part 47 of the portion $402_a$, constitutes the collector of the input transistor $T_{e2}$.

The portion of the first epitaxial layer 401 situated on the side of the section $53_a$ of the insulating barrier opposite to that in which the first transistor is formed, comprises itself 2 portions: first, the portion 46 which extends on a large part of the portion 42 of the substrate with which it constitutes the collector of the output transistor $T_{s2}$; moreover, a portion 45 in the form of an elongate narrow segment between the said two insulating barriers $53_a$ and 54 has been separated by means of an additional insulating barrier 54 which is substantially parallel to the section $53_a$.

This segment 45 is connected by a first extremity $45_a$ via the connection zone of the passage 405 to the base 44 of the first transistor and by its second extremity $45_b$ to the zone 46 of the external region of the second transistor $T_{s2}$ formed in the said first epitaxial layer 401, that is to say in this example to the collector of the second transistor. It constitutes a resistor connected in series with the parasitic resistor parallel to the base-emitter junction of the input transistor. Thus said resistor may be given a high value, for example, 10 kΩ.

An advantage of this topology resides precisely in the high value which this elongate form gives to the resistor $R_{e2}$.

The section of the insulating barrier 54 also separates, in the second epitaxial layer 402, the portion 48 from the portion $402_b$. The portion 48 is insulated from the collector 47 by the junction 409 which it has at one of its extremities with the base contact 52 which is homeomorphous to a ring. At its other extremity it is connected to the portion $402_b$ which extends above the collector 46 of $T_{s2}$.

In this portion $402_b$ are diffused the highly doped N+ type zone 55 of a smaller depth than the thickness of the second epitaxial layer which constitutes the emitter of $T_{s2}$ and, around the zone 55, the highly doped P+ type zone 50, also less deep than the layer itself and which constitutes the base contact zone, the base of $T_{s2}$ being constituted by the subsisting part of the portion $402_b$. The zones 50 and 51 are advantageously diffused by the same thermal operation. The emitter and the base contact are given an interdigitated shape as shown in FIG. 6.

The device is covered by an insulating and passivating oxide layer 56 also in the grooves 53 and 54 and on the sides of the mesa formed by the assembly of the layers and the substrate. Windows are opened in the layer 56 for the various contacts; metallic conductors are provided and constitute contacts 60 on the zone 51, 58 on the zone 50, 57 on the zone 55, and 63 on the zone 52, a conductor 59 situated on the passage 405 and above the segment 45 which joins the two transistors forming a connection between the zone 50 and the zone 51.

The resistor $R_{s2}$, and is in the preceding example the resistor $R_{s1}$, is realized by a localized shortcircuit of the base-emitter junction of the transistor $T_{s2}$ and is referenced 62.

The lower face of the device comprises a metallic deposit 61 establishing a connection between the parts 41 and 42 of the substrate.

Thus a mixed Darlington arrangement is available, the input transistor $T_{e2}$ of which has an emitter 41, a base 44, a collector 47, a base contact zone 52, a collector contact zone 51, of which the power transistor $T_{s2}$ has a collector 46, a collector conduction zone 42, a base 49, an emitter 55, a base contact zone 50, of which the output resistor is at 62 and of which the resistor parallel to the base-emitter junction of the input transistor is high.

Figure 8:
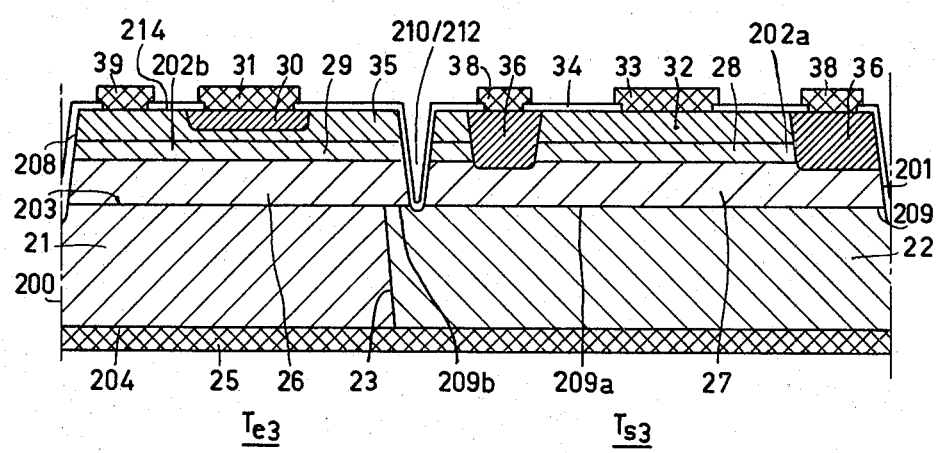
FIG. 8 is a diagrammatic sectional view taken on the line VIII—VIII of FIG. 9 of an assembly of two complementary transistors of the second embodiment and the second configuration.

In the device shown in FIGS. 8 and 9, which shows at the same time the "second configuration" and the "second embodiment" defined above, two complementary transistors $T_{e3}$ and $T_{s3}$ also constituting a mixed Darlington are integrated in a semicondcutor body formed by a flat substrate 200 comprising two highly doped portions 21 and 22 of opposite conductivity types separated by a junction 23, by a first epitaxial layer 201 of the conductivity type of the portion 21 (first conductivity type) but lightly doped, which extends on a face 203 of the substrate 200 and constitutes with the portion 22 of the substrate 200 a junction 209 and by a second epitaxial layer 202 which is lightly doped and of the second conductivity type opposite to that of the preceding layer and which extends thereon. An insulating barrier 212 realized starting from a groove 210 separates the first epitaxial layer 201 into two portions 26 and 27 and the second epitaxial layer 202 into two portions 202$_a$ and 202$_b$.

The bottom of the groove 202 slightly penetrates into the substrate 200 in the portion 22 thereof of a conductivity type opposite to that of the first epitaxial layer and cuts the junction 209 into two parts 209$_a$ and 209$_b$. The said junction 209$_b$ terminates on one side against the insulating barrier 212 and on the other side against the junction 23 which separates the portions 21 and 22 of the substrate. The junction 209$_b$ intersects the junction 23, the junction 23 extending from the lower face 204 of the substrate (opposite to the face 203) up to the insulating barrier 212. Said junction separates the regions 26 and 21 from the region 22.

It will be apparent that the position of the meeting point of the junctions 209$_b$ and 23 is not critical, which is favorable from the point of view of manufacture.

The portion of the substrate 21 constitutes a conduction zone of the emitter region of the input transistor T$_{e3}$, "second transistor" of the device, while the portion 22 constitutes the collector of the power transistor T$_{s3}$ "first transistor" of the device.

The insulating barrier separates in the first epitaxial layer 201 the portion 26 which constitutes the emitter of the second transistor from the portion 27 which constitutes the base of the first transistor and in the second epitaxial layer the portion 202$_a$ of which a part constitutes the emitter zone 28 of the first transistor from the portion 202$_b$ of which a part constitutes the base zone 29 of the second transistor.

A highly doped shallow diffused zone 30 of the first conductivity type constitutes the collector of the second transistor and a diffused zone 36 extending from the upper face 214 down to a depth exceeding the thickness of the second epitaxial layer and highly doped with the first conductivity type homeomorphous to a ring surrounding the zone 32 ensures the contact on the base of the first transistor.

A highly doped surface layer 208 of the same second conductivity type as the second epitaxial layer 202, diffused therein, constitutes the emitter contact 32 of the first transistor and the base contact 35 of the second transistor.

A resistor parallel to the emitter-base junction of the output transistor is realized, as in the preceding example the resistor 62, by a projection of the region 36 which extends to below the emitter contact 33. Said projection is referenced 213 in FIG. 9.

A metallic deposit 25 on the rear face of the device ensures a short-circuit of the junction 23 between the portions 21 and 22 of the substrate and constitutes at the same time a contact for the collector of the first transistor and the emitter of the second.

In order to ensure a better flatness of surface of the device, the insulating barrier 212 is interrupted by a passage 205 which supports a connection pad 206. At the level of the second epitaxial layer the insulation between on the one hand the base 29 of the input transistor T$_{e3}$ (second transistor) and on the other hand the emitter 28 (and its contact 32) of the output transistor T$_{s3}$ (first transistor) is ensured by the base contact 36 of the output transistor which is homeomorphous to a ring surrounding completely the said emitter 28 and its contact 32.

At the level of the first epitaxial layer the said passage 205 involves the existence of a connection zone which constitutes a resistor between the base 27 of the output transistor and the zone 26 of the emitter of the input transistor connected by the metallic layer 25 to the collector 22 of the output transistor. Since the first epitaxial layer is lightly doped, said resistor has a strong value and for that reason does not present major inconveniences.

Inconveniences, if any, resulting from the presence of said resistor parallel to the base-collector junction of the output transistor can notably be minimized, as in the example described with reference to FIGS. 6 and 7, by placing in series with it the resistor of an elongate portion in the form of a segment of the portion of the first epitaxial layer situated beside the insulating barrier, opposite to that of the first transistor analogous to the portion 45 in the form of a segment described in the said example. This segment is separated from the emitter proper of the second transistor by an additional insulating barrier parallel to the said insulating barrier analogous to the additional barrier 54 parallel to the segment 53$_a$ of the barrier 53. A first extremity of the said segment is connected to the base of the first transistor (output transistor) by the said passage zone, and the second extremity is connected to the emitter of the second transistor (in this case input transistor). In order to increase said resistance the interruption of the barrier may also be replaced by a discontinuity notably by diminishing the depth of the groove, which constitutes a compromise solution.

The surface of the device is covered by an insulating layer 34 in which contact windows are made.

Contacts are made by means of a metallic deposit, 31 on the collector and 39 on the base of the input transistor (second transistor), 33 on the emitter and 38 on the base of the output transistor (first transistor). Thus a mixed Darlington arrangement is obtained of which the output transistor, first transistor, has an emitter 29 of which the contact region is at 32, a base 27 of which the base contact region is at 36, a collector 22 and of which the input transistor, second transistor, has an emitter conduction region 21, an emitter region 26, a base 29 of which the base contact region is at 35, and a collector region 30.

The output of the amplifier is constituted by the metallic layer 25 which short-circuits the regions 21 and 22. The connection between the collector of the input transistor, second transistor, and the base of the output transistor (first transistor) is made by the metallic layer 206. In this assembly the input transistor may be either of the npn type if the first epitaxial layer is of the N type, or of the pnp type, if the first epitaxial layer is of the P type, the output transistor being of the complementary type.

In either case, the Darlington arrangement thus obtained is complementary to an assembly of the first embodiment created on the same plate.

Figure 10:
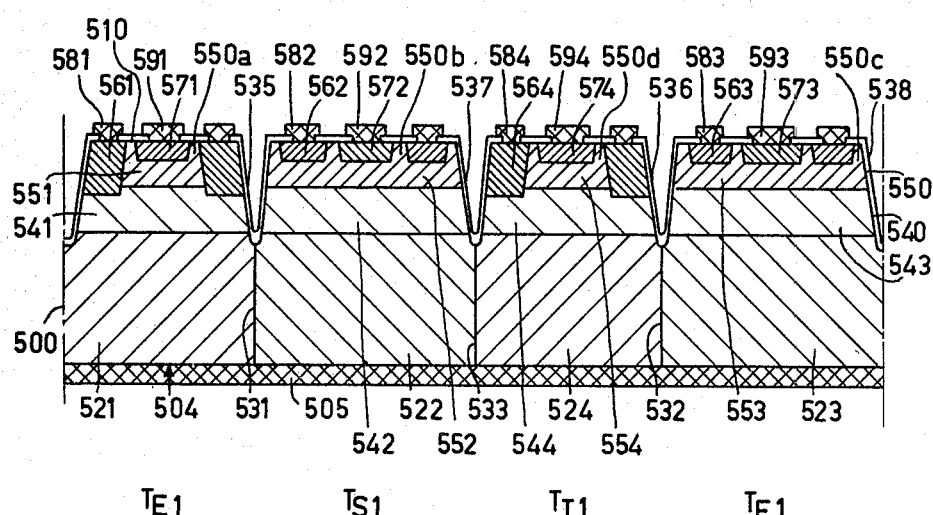
FIG. 10 is a diagrammatic sectional view of a so-called push-pull amplifier comprising two complementary assemblies with two complementary transistors.

FIG. 10 is a sectional view of a so-called push-pull amplifier constituted by two complementary assemblies arranged in mixed Darlington arrangements in accordance with FIG. 2 (except that the resistors R$_s$ are not shown in FIG. 10) elaborated in a semiconductor body constituted notably by the substrate 500 comprising portions of the two conductivity types, on which bears a first epitaxial layer 540 of a first conductivity type on which also extends a second epitaxial layer 550 of the second conductivity type opposite to the first.

In order to simplify the Figure, all these assemblies have been given the first configuration (that of FIGS. 3, 4, 5, 6 and 7).

The first assembly is constituted by the input transistor $T_{E1}$, "first transistor of the first assembly", and by the output transistor $T_{S1}$, "second transistor of the first assembly". The first assembly is of the first embodiment.

The second assembly is constituted by the input transistor $T_{F1}$ "second transistor of the second assembly" of a type opposite to the type of the transistor $T_{E1}$ and by the output transistor $T_{T1}$ "first transistor of the second assembly". This second assembly is of the second embodiment.

This semiconductor device which comprises a first mixed Darlington arrangement constituted by a first assembly of complementary transistors, the input transistor $T_{E1}$ of the said first arrangement being the "first transistor" of the said first assembly and comprising notably an emitter 521 constituted by a portion of the substrate, a base 541 constituted by a portion of the first epitaxial layer, of which the contact region 561 which is homeomorphous to a ring traverses the second epitaxial layer, a collector constituted by the subsistent part 551 of the portion $550_a$ of the second epitaxial layer after there has been created in it notably the base contact region 561 homeomorphous to a ring and possibly the collector contact region 571 and metallized base and collector contacts 581 and 591, respectively, the output transistor $T_{s1}$ of the said first arrangement being the second transistor of the said assembly and comprising a collector conduction zone 522 constituted by a portion of the substrate, a collector 542 constituted by a portion of the first epitaxial layer, a base 552, a subsistent part of the portion $550_b$ of the second epitaxial layer after there has been created in it the emitter region 572 of the first conductivity type and possibly the base contact zone 562 of the second conductivity type, both having a depth smaller than the thickness of the second epitaxial layer, and metallized base and collector contacts 582 and 592, respectively, the base and the collector of the first transistor being separated from the base and the collector of the second transistor by an insulating barrier 535 which extends from the upper face 510 down to a depth exceeding the thickness of the two epitaxial layers and penetrates in the substrate, the portions 521 and 522 being of opposite types and separated by a junction 531 which constitutes at least a part of a junction which extends from the lower face 504 of the substrate up to the barrier 535 (in the Figure it directly adjoins it), the emitter 521 of the first transistor and the collector 522 of the second transistor being short-circuited by a conductive layer 505 deposited on the lower face 504 of the substrate 500 and the collector 551 of the first transistor $T_{E1}$ being connected to the base 552 of the second transistor, and also comprises in the same semiconductor body a second assembly of complementary transistors, the said second assembly being complementary to the said first assembly of the second embodiment and being arranged also in a mixed Darlington arrangement.

The said second mixed Darlington arrangement is constituted notably by a third transistor $T_{F1}$ and a fourth transistor $T_{T1}$, which transistors are vertical bipolar transistors.

The said third transistor $T_{F1}$, second transistor of the second assembly, has a base constituted by the subsistent part 553 of the portion $550_c$ of the second epitaxial layer 550 of which the possible contact region is at 563, a collector 573 constituted by an over-doped region of the first conductivity type included in the said portion 550 of the second epitaxial layer, an emitter constituted by a portion 543 of the first epitaxial layer and by a portion 523 of the substrate of the first conductivity type which underlies the portion 543 and constitutes a conduction zone..

The said fourth transistor $T_{T1}$, first transistor of the second assembly, has a base 544 constituted by a portion of the first epitaxial layer of which the overdoped contact region 564 homeomorphous to a ring traverses the second epitaxial layer, a collector 524 constituted by a substrate portion of the second conductivity type, and emitter 554 (of which the possible contact region is at 574) constituted by the subsistent part of the portion $550_d$ of the second epitaxial layer.

The various portions of the substrate, of the first epitaxial layer and of the second epitaxial layer are respectively coplanar between themselves and with the portions used for the first and the second transistors of the first assembly.

The two substrate portions 523 and 524 of opposite types used for the said third and fourth transistor (respectively second and first transistor of the second assembly) are contiguous and form a p-n junction 532 which constitutes at least a part of a junction which extends from the lower surface of the substrate up to an insulating barrier 536 which, extending from the upper face 510 down to a depth exceeding the thickness of the two epitaxial layers, separates entirely in the two said layers at least a part of the portions used for the further transistor $T_{F1}$, from portions used for the fourth transistor $T_{T1}$ and which extend up to the substrate.

The regions of the first and second transistors of the first assembly constituted by portions of epitaxial layers are separated from adjacent regions of the third and fourth transistors (respectively second and first transistors of the second assembly) by an insulating barrier 537 extending from the upper face 510 down to a depth exceeding the thickness of the two said epitaxial layers down to the substrate.

The collector 573 of the third transistor is reunited at the base 544 of the fourth transistor by a metal film not shown in the Figure, and the four regions created in the substrate are short-circuited by a conductive electrode 505 formed on the lower face 504 of the substrate 500. The third and the fourth transistor constitute a second Darlington amplifier arrangement of the type opposite to that of the first assembly, the input transistor of the said second assembly being the third transistor $T_{F1}$ and the output transistor being the fourth transistor $T_{T1}$.

The second assembly constitutes with the first assembly a push-pull amplifier of which the inputs are the bases of the first transistor of the first assembly and of the second transistor of the second assembly (third transistor), and of which the output is formed by the conductive electrode formed on the lower face of the substrate.

The two complementary assemblies in Darlington arrangement constituting a push-pull amplifier may present two different topologies.

In the first topology just described, the substrate is divided into four portions of alternate conductivity types, 522 and 523 being of the first conductivity type while 521 and 524 are of the second conductivity.

The contiguous substrate portions belonging to two different assemblies are of opposite types and are separated by a junction. So this constitutes at least a part of a junction which extends from the lower face of the substrate up to the barrier. In FIG. 10, which shows the first topology, the portions 522 and 524 contiguous with the substrate are separated by a junction 533 which directly rejoins the bottom of the insulating barrier 537.

As in the second configuration, said junction 533 could terminate on the side of the barrier 537 where the substrate portion is of the first conductivity type.

In the second topology shown in FIG. 12 the contiguous substrate portions belonging to two different assemblies are of the same type.

The four portions 521, 522, 523 and 524 of the substrate are short-circuited by a metallized electrode 505 which constitutes the common output terminal A in FIG. 2 and which is deposited on the lower face 504 of the substrate.

The upper face of the device is covered by an insulating and passivating layer 538 in which apertures have been provided which are not shown in the Figure and permit the creation of the above-mentioned metallic contacts.

Said oxide layer also contributes to the insulating barriers by covering the grooves already mentioned.

The collector of the input transistor $T_{E1}$ is connected to the base of the output transistor $T_{S1}$ by a metallized path extending from one transistor to the other at a point where the insulating barrier 535 is interrupted.

In the same way the collector of the input transistor $T_{E1}$ is connected to the base of the output transistor $T_{S1}$ by a metallized path extending from one transistor to the other at a point where the insulating barrier 536 is interrupted.

The metallized contacts 591 and 593 of the bases of the two input transistors which constitute the inputs of the amplifier have connections not shown in the Figure.

These interruptions in the barriers 535 and 536 as well as the two metallized paths are not shown in FIG. 10. They are entirely analogous to those which are shown in FIGS. 3, 4, 5, 8 and 9.

Output resistors $R_s$ of the two assemblies may be placed in a manner identical to that which has been described for the first example. They are not shown in FIG. 10.

In the same way, a topology may be adapted analogous to that of FIGS. 6 and 7 to augment the value of the resistors parallel to the emitter-base junction of the transistor $T_{E1}$ and to the collector-base junction of the transistor $T_{F1}$ to avoid that same does not possibly play a detrimental part.

It is to be noted that the insulating barrier 537 should not be interrupted, so that the topology of the first assembly constituted by transistors $T_{E1}$ and $T_{S1}$ is independent of the topology of the second assembly constituted by the transistors $T_{F1}$ and $T_{T1}$.

So a symmetrical push-pull amplifier is now obtained in accordance with the diagram of FIG. 2 in which the point A in the device formed by the metallic electrode of the rear face of the substrate constitutes the low-frequency output but is not at the high voltage, which constitutes a of safety factor, since when said electrode is connected to the case of the dissipator, the user cannot touch the high voltage. Moreover, due to the fact that the substrate is soldered to a base, the whole device is at the same temperature and the supplementary circuitry necessary with the discrete elements to ensure temperature stability may be omitted.

The manufacture of an assembly of transistors according to the invention notably comprises the following operations:

In a plate of a first conductivity type impurities giving the conductivity type opposite to the preceding type are introduced locally at least to a certain thickness of the substrate in a concentration higher than that of the said plate to obtain therein portions of the two conductivity types, then a first low-doped epitaxial layer is deposited on one of the large faces of the said plate on which portions of the two conductivity types grow, then a low-doped second epitaxial layer of the conductivity type opposite to that of the said first epitaxial layer is deposited thereon; localized regions are then created of which at least two are of the conductivity type of the first epitaxial layer, one having a depth exceeding the thickness of the second epitaxial layer being destined to constitute the base contact of the first transistor, the other destined to constitute an external zone of the second transistor being included in the second epitaxial layer, and the insulating barrier is made, and the contacts and the connections are formed.

The localized introduction in the plate of the first conductivity type of impurities destined to form in the plate coplanar portions of the opposite type may be carried out according to two different methods.

According to a first embodiment of the method of manufacturing the device according to the invention, portions of the opposite type in a substrate of a first conductivity type may be realized by thermomigration, for example, thermomigration of aluminum in a substrate of silicon as described hereinafter with reference to FIG. 11 of which the diagrams 11A to 11F are sectional views of the various stages of said process.

The starting material, for example, is a silicon plate 500 of the N or $N^{30}$ type doped with antimony, for example in a concentration of approximately $5.10^{18}$ atoms/cm$^3$, having a diameter of 75 mm, a thickness of the order of 350 μm of which the surface are ground but not polished, and of which the principal faces are in the (111) crystal plane.

Said plate is subjected to a thermal oxidation treatment so as to form at its surface a thermal oxide layer 501 in a thickness of 2 micrometers.

By means of a layer of photosensitive lacquer not shown in the Figures, the locations corresponding to the portions of the N type of the substrate which are to be maintained are protected on one of the faces 502 of the plate chosen as the active face. By means of a readily buffered hydrofluoric acid solution the oxide layer is etched in known manner at the locations not protected and referenced $503_a$, $503_b$, etc. and these locations are exposed. The plate in this stage is shown in FIG. 11. The oxide areas maintained are referenced $501_a$, $501_b$, etc.

Experience shows that, in order to avoid the melted aluminum forming into balls at the beginning of the thermomigration operation, it is essential to give the locations 503 an elongate slotted shape of a width of 50 μm to 500 μm and advantageously of 300 to 400 μm, and a length of 5 to 10 times the width. For a length of approximately 2 mm necessary to form the device according to the invention, a width of 300 to 400 μm is excellent. In this manner P-type channels in the substrate are obtained in a width which is insufficient to form the greater part of the devices.

However it has been found from experience that it is possible to obtain portions of the P type which are wider while forming a plurality of channels starting from a plurality of substantially parallel slots separated by a spacing of 1 μm to 50 μm, for example 15 μm.

During the thermomigration, the lateral diffusion is extremely weak but during the numerous subsequent thermal treatments it is sufficient so that the interval between two adjacent channels obtained by thermomigration is annulled.

Each portion to be transformed is thus covered by at least a plurality of said slots, the latter extending all over the surface of the said portion.

Figure 11A:
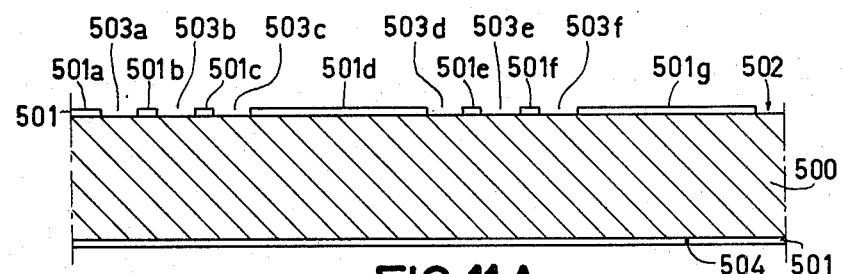
FIG. 11 shows nine diagrammatic sectional views referred to as 11A to 11I of the various stages of the manufacture of the device shown in FIG. 10 according to the first embodiment of the method according to the invention.

FIG. 11A shows two groups of slots each destined for the formation of a substrate portion which may be used for the manufacture of a device according to the invention; these two groups are separated from each other by the oxide area $501_d$ and other groups by the areas $501_a$ and $501_g$.

The slots $503_a$, $503_b$ and $503_c$ separated by the oxide areas $501_b$, $501_c$ constitute the first group and the slots $503_d$, $503_e$, $503_f$ separated by the oxide area $501_e$ and $501_f$ constitute the second group.

Figure 11B:
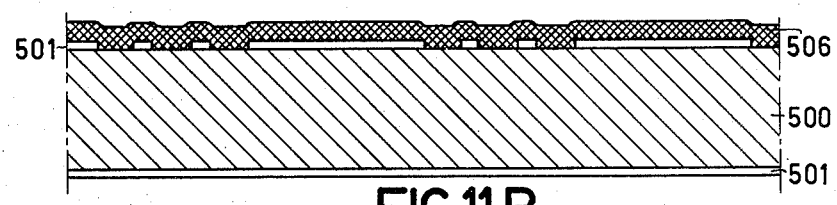

During the subsequent step, an aluminium layer 506 having a thickness of 6 to 10 $\mu$m is deposited, for example, by evaporation in a vacuum, on the whole plate. FIG. 11B shows the plate in this stage.

By means of a photosensitive layer, a mask not shown in the Figure is formed, the shape of which is exactly the inverse of that of the preceding mask.

Figure 11C:
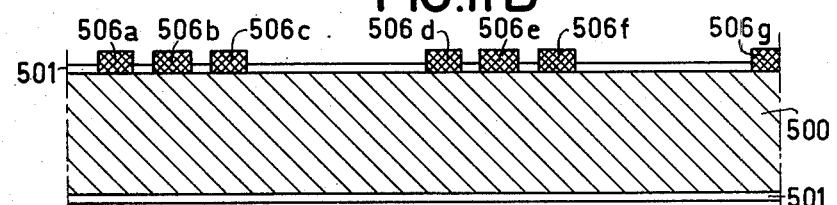

By a chemical treatment, all the aluminum areas deposited on the remaining areas ($501_a$, $501_b$, etc) are removed from the oxide layer and the aluminum areas ($506_a$, $506_b$, etc) deposited between the oxide areas in the slots 503 directly on the silicon are maintained. The mask is then removed. FIG. 11C shows the plate in this stage.

The plate is then annealed under nitrogen at 560° C. for 15 minutes.

In order to obtain the temperature gradient necessary for the thermomigration, the said plate is then placed in an epitaxy reactor heated by induction, the active face 502 of the said plate being uppermost. The plate is placed on a graphite receiver coated with a layer of silicon carbide covered itself by a layer of silicon. A thermomigration may be obtained for a temperature of the receiver (to which the temperature of the rear face of the plate is substantially equal) between 1050° C. and 1200° C. Advantageously it is between 1140° and 1160° C., while in the example described it is 1150° C. The temperature difference between the active face and the rear face of the plate may be between 5° C. and 70° C. In the example described the temperature of the active face was of the order of 1100° C. The temperature difference is obtained by a scavenging with a strong supply (for example 120 l/minute) of hydrogen which cools the active face of the plate. This operation lasts from 10 to 20 minutes).

The aluminum migrates in the direction of the gradient and, if this is well controlled, this direction is preferably perpendicular to the plane of the face 502. Absolute perpendicularly is not necessary. The direction of the gradient may be in a cone having an apical angle of 30° and even 45° and an axis perpendicular to the faces of the plate.

In FIG. 8, the angle of the junction 23 with the planes of the faces of the plate has deliberately been shown to be different from a right angle.

Figure 11D:
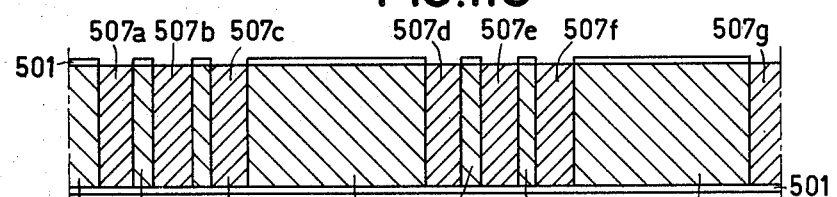

In this manner the channels referenced 507 index of the P type are formed whereas the zones 525, $509_a$, $509_b$, 522, $509_c$, $509_d$, 523 remain of the N type. FIG. 11D shows the plate in this stage.

During the thermomigration, the lateral diffusion of aluminum which migrates owing to the temperature gradient is substantially zero and the P doped zones do not laterally project from the channels or underlying volumes at the slots 503 but, as a result of the lateral diffusion which occurs subsequently during the manufacture of the device (during the epitaxial treatment at 1170° C. and the diffusion treatment at a temperature of the order of 1100° C.), the channels $507_a$, $507_b$, $507_c$ on the one hand and $507_d$, $507_e$, $507_f$ on the other hand unite to form a single zone 521 and a single zone 524 (see FIG. 11F) while annihilating the zones $509_a$, $509_b$, $509_c$, $509_d$ of the N type. These zones 521 and 524 comprise a quantity of $5.10^{19}$ atoms of aluminum per cm$^3$.

If accidentally a thin intermediate zone of the N type should remain in the interior of a P zone, its presence would be without consequences, in particular because the various portions of the substrate are short-circuited at the rear face. Moreover, if necessary, a light diffusion operation of boron on the P zones may be added before the epitaxial treatments to avoid having separate zones on the emitter of the input transistor.

This operation which is not shown in the Figure has the additional advantage of entailing, between the surface of the N portions and that of the P portions of the substrate, a slight unevenness which has repercussions on the surface of the epitaxial layers and permits fixing with precision the position of the elements formed from the active face, notably that of the insulating barriers with respect to the corresponding junctions between two contiguous substrate portions.

It is to be noted that the depth of the introduced impurities may be limited to a value lower than the thickness of the plate by causing, on the side of the face opposite to the face of introduction, a layer of the initial conductivity type to subsist which is eliminated afterwards from the said opposite face, for example just before the deposition of the metallic electrode on the rear face and soldering by said face to the casing. So during the duration of the manufacturing operations a plate is available which is thicker and hence mechanically more resistant to damage.

The upper face 508 of the plate is then prepared for the epitaxial deposition.

Figure 11E:
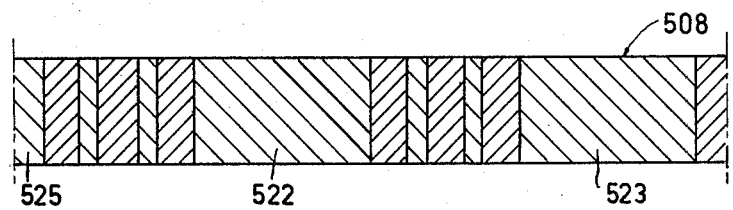

Since the surface regions of the P type zones are extremely disturbed and may present impurity concentrations which are quite different from the concentrations in volume, both near one face and near the other face, after having removed the remaining areas of the oxide layer 501, a thickness of silicon of 30 $\mu$m is removed, for example by chemical etching, from one and the other face. FIG. 11E shows the plate in this stage.

This same active surface is then polished by grinding and the deposition of a first epitaxial layer 540 of N type silicon doped with arsenic in a concentration of $10^{15}$ atoms/cm$^3$ giving a resistivity of 3 $\Omega$cm, in a thickness of 10 $\mu$m is then carried out by means of known methods. A second eptiaxial layer 550 of P type silicon doped with boron in a concentration of $3 \times 10^{15}$ atoms/cm$^3$ in a thickness of 7 $\mu$m is then deposited.

Figure 11F:
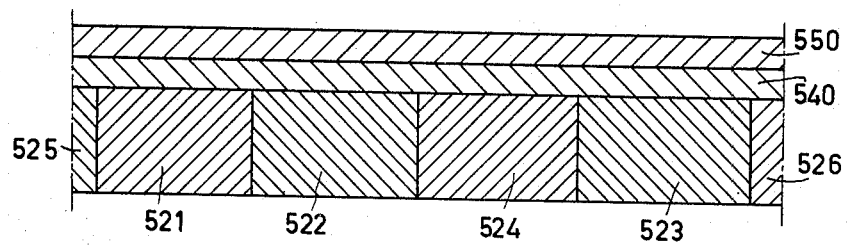

In this stage the plate is ready for the diffusion operations. It is shown in FIG. 11F, in which the P type zones 521 and 524 are shown as finished.

A first phosphorus diffusion is carried out on the areas corresponding to the base contact zones of the two pnp transistors $T_{E1}$ and $T_{T1}$ so as to obtain zones 561 and 564 of the N$^+$ type reaching the first epitaxial layer.

Figure 11G:
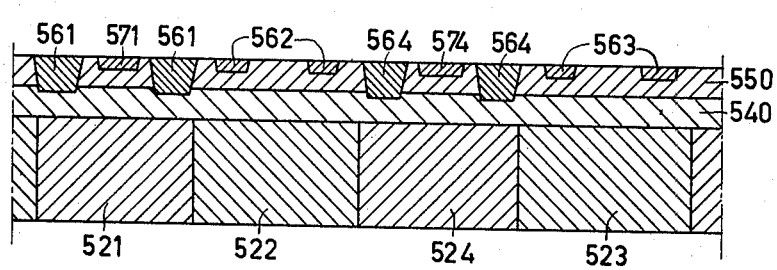

A boron diffusion is then carried out on the areas corresponding to the collector-base contact zones of the transistor $T_{E1}$, the emitter of the transistor $T_{T1}$, and the bases of the transistors $T_{F1}$ and $T_{S1}$ so as to obtain highly doped P+ type zones 571, 574, 562, 563 of a depth smaller than the thickness of the second epitaxial layer. FIG. 11G shows the plate in this stage.

Figure 11H:
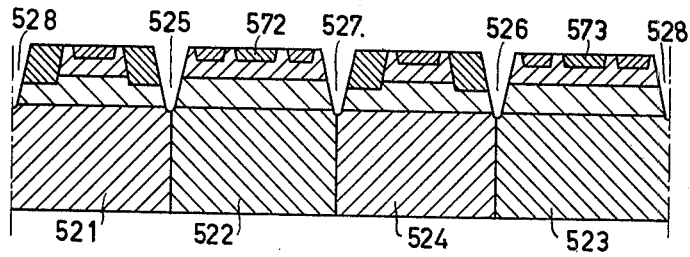

A phosphorus diffusion is then carried out according to the areas corresponding to the emitter of the transistor $T_{S1}$ and to the collector of the transistor $T_{F1}$ so as to obtain highly doped N+ type zones 572 and 573 of a depth smaller than the thickness of the second epitaxial layer Grooves 525, 526, 527 having a dpeth which is sufficient to reach the substrate, of a minimum width, are made by an etching treatment which is adequate to separate the various transistors from each other, according to a layout leaving for the support of the connections narrow passages interrupting them and not shown in the Figure. Simultaneously with said grooves 525, 526 and 527, grooves 528 determining the boundaries of the device, for example, at the edge of a plate in which several identical devices are formed simultaneously are also made and give the device a mesa shape. FIG. 11H shows the plate in this stage.

The surface of the device is covered by a passivating and insulating silicon oxide layer 538. Said layer covers the grooves 525, 526, 527 with which it constitutes the insulating barriers 535, 536, 537.

Figure 11I:
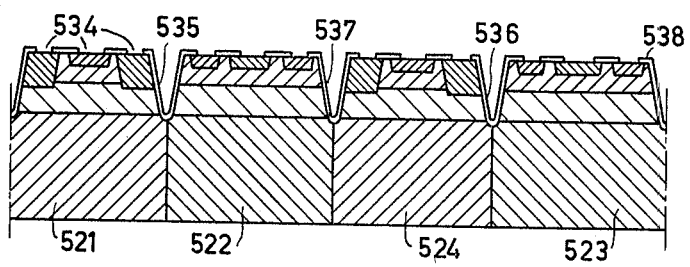

Contact windows 534 are made in said layer 538. FIG. 11I shows the plate in this stage.

An aluminum deposit is carried out and the various contacts and connections are obtained by an appropriate etching operation as follows (see FIG. 10): base contact $T_{E1}$ at 581, collector contact of the transistor $T_{E1}$ at 591, emitter contact of the transistor $T_{S1}$ at 592, base contact of the transistor $T_{S1}$ at 582, base contact of the transistor $T_{S1}$ at 583, collector contact of the transistor $T_{F1}$ at 593, emitter contact of the transistor $T_{T1}$ at 594 and base contact of the transistor $T_{T1}$ at 584.

The connections between the collector contact 591 of the transistor $T_{E1}$ and the base contact of the transistor $T_{S1}$ and between the collector contact 593 of the transistor $T_{F1}$ and the base contact of the transistor $T_{T1}$ obtained at the same time as the said contacts are not shown in the Figure.

The emitter contacts of the transistor $T_{E1}$ and $T_{F1}$ and the collector contacts of the transistors $T_{S1}$ and $T_{T1}$ are obtained by means of an aluminum deposition 505 on the rear face of the plate. The device obtained is the device shown in FIG. 10, the structure of which has been described above.

The method of manufacturing the device according to the invention is extremely simple and reliable. Notably, the device does not comprise any buried layers. The connections are particularly easy to make. The safety which it procures for the users is excellent. Thermal stability is ensured. The realization of the portions of the substrate of the type opposite to the initial type is rapid, it comprises few operations and it is hence economical.

The various diagrams 12A to 12H which compose FIG. 12 show the various stages of the manufacture of also-called push-pull amplifier according to the invention manufactured according to the second mode of performing the method of manufacturing the device according to the invention. According to this second mode, portions of opposite types in a substrate of a first conductivity type are obtained by diffusion.

As the substrate must exhibit the mechanical rigidity necessary for the fabrication processes, its thickness may make the duration of a diffusion operation throughout its thickness prohibitive; in this case it is possible to make cavities in the plate prior to the diffusion, locally reducing the thickness to a favorable value.

Starting from a first face of the plate at least a group of cavities is then cut; each group comprising at least one cavity having a depth between 0.25 and 0.40 times the thickness of the plate, the length and the width of each of the cavities being smaller than 1 mm and the distance between two cavities of the same group being from one time to one and a half times the desired diffusion depth. Starting from the bottom of the said cavity at least one diffused zone is formed locally in a depth of between 0.25 and 0.40 times the thickness of the plate by means of the impurities to be introduced. Starting from the second face, opposite to the said first face, the plate is then made thinner until the said diffused zone of the opposite type is level with the new surface of the said plate on said second face. The first and then the second expitaxial layer are then deposited successively on said new surface. Starting from said second face, the regions of at least one said "first" and one said "second" transistor separated by an insulating barrier are formed notably by diffusions in the epitaxial layers.

The zone diffused locally in the substrate on the one hand and at least a portion of the substrate of the first type on the other hand constitute at least a part of the collector region of one of the transistors and at least a part of the emitter region of the other transistor, respectively.

On said second face of the plate the contact metallizations and connections are then made and starting from the said first face of the plate and, preferably just before soldering the device to a casing by said face, a layer is removed in a thickness at least equal to the depth of the cavities and on the new first face the contact metallization of the regions made in the substrate are realized.

A plate 860 of the N type or N+ type doped with antimony, for example, in a concentration of approximately $5.10^{18}$ atoms/cm$^3$ is chosen in a thickness lying between 300 $\mu$m and 600 $\mu$m (in the example 450 $\mu$m) in order achieve sufficient rigidity and solidity to withstand the fabrication.

Figure 12A:
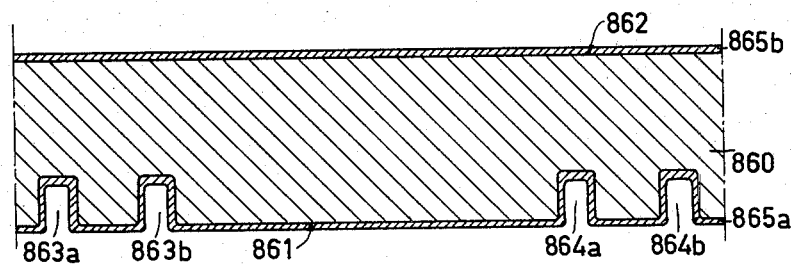
FIG. 12 shows eight diagrammatic sectional views, referred to 12A to 12H, of the various stages according to a second embodiment of the method according to the invention of the manufacture of a so-called symmetrical push-pull amplifier of a slightly different topology.

FIG. 12A shows said plate in which, starting from a first face 861, two groups of two cavities $863_a$ and $863_b$ on the one hand and $864_a$ and $864_b$ on the other hand have been made in a depth of 150 $\mu$m (between 0.25 and 0.40 times the thickness of the said plate), of a square section, on one side preferably smaller than 1 mm (in the example 700 $\mu$m). The two cavities of one group are separated by a distance of 200 $\mu$m (from one to one and a half times the desired diffusion depth). The two groups of cavities are separated by a distance of at least 1 mm.

The diffusion is carried out starting from the two faces of the plate, the face destined to suppport the expitaxial layers or active face or upper face, and the lower face which is opposite to it and starting from which the said cavities are made.

Since the oxide is a poor mask for a deep diffusion, a boron-doped layer $865_a$ and $865_b$ having a thickness of 1 $\mu$m has been made directly on each of the two exposed faces 861 and 862 of the plate. The deposition of boron is carried out at 1100° C. for 1 hour.

Figure 12B:
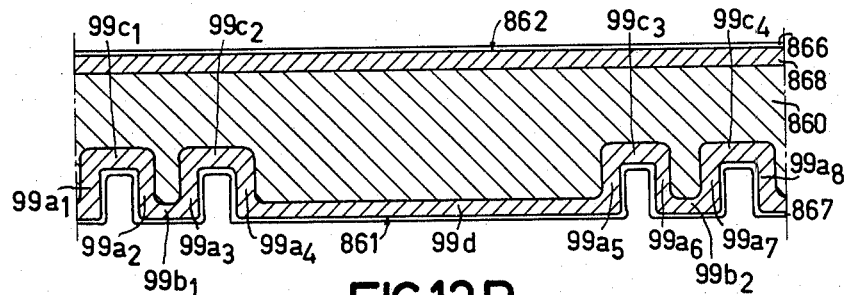

A diffusion heating is then carried out in air at 1280° C. for approximately 120 hours. The boron diffuses in the plate and two thin oxide layers 866 and 867 are formed on each of the faces of the plate, FIG. 12B shows the plate during the diffusion. A first P type zone 868 is formed starting from the face 862 and a second P type zone of the same depth 99 is formed starting from the face 861.

In this layer, the portions indicated $_a$, at the edge of the cavities, are due to the lateral diffusion.

Figure 12C:
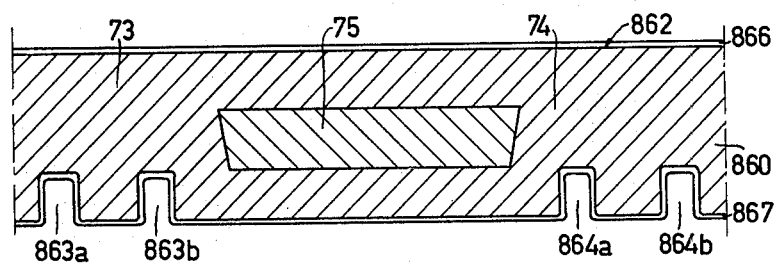

FIG. 12C shows the plate at the end of the diffusion operation. The distance between the cavities $863_a$ and $863_b$ on the one hand and between the cavities $864a$ and $864b$ on the other hand, lying between one and one and the half times the diffusion depth, the portions $99_{a2}$ and $99_{a3}$ on the one hand and $99_{a6}$ and $99_{a7}$ on the other hand of the layer 99 are united. The thickness (in the example smaller than 300 μm) between the bottom of the cavities and the surface 862 being smaller than the double diffusion depth (150 μm), the portions $99_{c1}$, $99_{c2}$, $99_{c3}$ and $99_{c4}$ of the layer 99 join the layer 868.

In this manner two large zones 73 and 74 of the P type are formed situated on either side of a subsistent zone 75 of the N type in a thickness near 130 to 140 μm, the oxidation of the surfaces having absorbed a thickness of 2 to 3 μm of silicon on either side of the plate.

The following step consists of making the plate thinner mechanically and/or chemically starting from the surface 862 and eliminating on said surface a thickness corresponding to the layer 868 of the P type diffused from said surface.

Figure 12D:
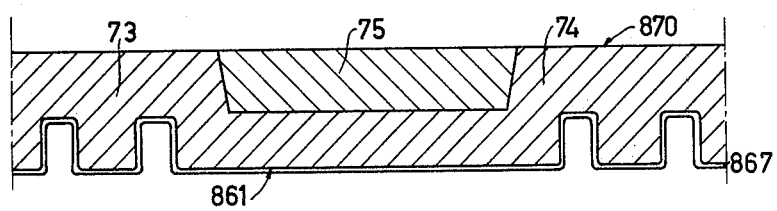

The region 75 becomes level with the new face 78 of the plate opposite to the face 861. It separates the two portions 73 and 74. FIG. 12D shows the plate in this stage. Once it is polished, it constitutes the substrate on which the epitaxies are carried out.

In an analogous manner a substrate could be obtained by diffusion comprising P portions and N portions starting from a P type plate and diffusing with phosphorus.

Figure 12E:
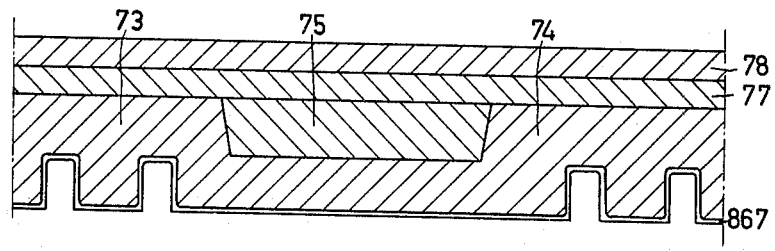

During the following step the deposition is carried out in known manner of a first epitaxial layer 77 of N type silicon doped with arsenic in a concentration of $10^{15}$ atoms/cm$^3$ in a thickness of 10 μm. A second epitaxial layer 78 of P type silicon doped with boron in a concentration of $3 \times 10^{15}$ atoms/cm$^3$ in a thickness of 7 μm is then deposited. FIG. 12E shows the plate in this stage.

Figure 12F:
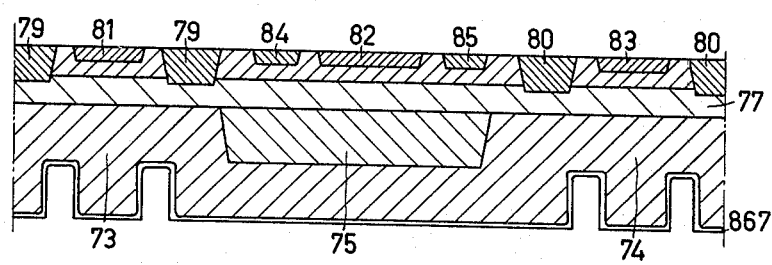

In areas corresponding to the base contact zone of the transistors $T_{E2}$ and $T_{T2}$, a first phosphorus diffusion is carried out to obtain the zones 79 and 80 of the N+ type reaching the first epitaxial layer. According to areas corresponding to the collector contact zone of the transistor $T_{E2}$, the emitter of the transistor $T_{T2}$ and the bases of the transistors $T_{S2}$ and $T_{F2}$, a boron diffusion is then carried out to obtain highly doped P+ type zones 81, 83 and 82, respectively, having a depth smaller than the thickness of the second epitaxial layer. In areas acorresponding to the emitter of the transistor $T_{S2}$ and to the collector of the transistor $T_{F2}$ a phosphorus diffusion is then carried out to obtain highly doped N+ type zones 84 and 85 having a depth smaller than the thickness of the second epitaxial layer. FIG. 12F shows the plate in this stage.

Grooves 86 having a depth sufficient to reach the substrate and a minimum width are cut, for example, by plasma etching, to separate the various transistors from each other according to a tracing leaving passages which then play the part of resistors not shown in the Figure. The two grooves $86_a$ and $86_b$ terminate at the junction 871 between the substrate portions 73 and 75 and at the junction 872 between the substrate portions 74 and 75, respectively.

The groove $86_c$ separates the base $82_a$ of $T_{S2}$ from the base $82_b$ of $T_{F2}$, two transistors of the same type.

At the same time as the grooves 86, grooves determining the boundaries of the device (not shown in the Figures) are also cut and give the device a mesa shape.

Figure 12G:
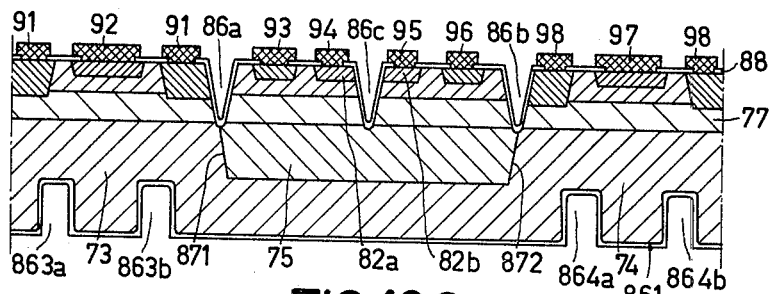
Figure 12H:
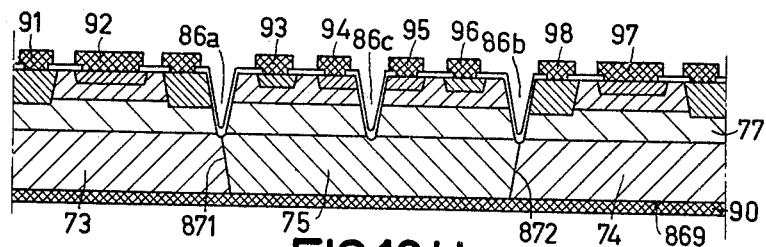

The surface of the device, including the grooves 86, is covered with an insulating and passivating silicon oxide layer 88 in which contact windows are made. An aluminum deposition is carried out and the various contacts and connections are obtained by a suitable etching operation: the base contact of the transistor $T_{E2}$ at 91, the collector contact of the transistor $T_{E2}$ at 92, the emitter contact of the transistor $T_{S2}$ at 93, the base contact of the transistor $T_{S2}$ at 94, the base contact of the transistor $T_{F2}$ at 95, the collector contact of the transistor $T_{F2}$ at 96, the emitter contact of the transistor $T_{T2}$ at 97 and base contact of the transistor $T_{T2}$ at 98. FIG. 12G shows the plate in this stage. Its thickness has been sufficient to avoid damage during the processing.

Just before soldering, a layer of the substrate is preferably removed from the face 861 in a thickness exceeding at the same time the thickness of the layer $99_d$ and the depth of the cavities 863 and 864. Thus the zone 75 becomes level with the new surface 869 to permit contact on the collector of $T_{S2}$ and the emitter of $T_{F2}$. On the other hand, the cavities being eliminated, the thermal transmission to the casing is excellent. The junction 871 between the regions 73 and 75 and the junction 872 between the regions 74 and 75 extend from the face 869 up to the barriers $86_a$ and $86_b$. The plate then has a thickness of the order of 150 μm.

The emitter contacts of the transistors $T_{E2}$ and $T_{F2}$ and the collector contacts of $T_{S2}$ and $T_{T2}$ as well as the connection between said regions are obtained by means of an aluminum deposit 90 on the rear face of the plate. The plate is then soldered to the casing.

FIG. 12I shows the plate just before soldering. It comprises two Darlington assemblies of opposite types constituting a symmetrical push-pull arrangement corresponding to FIG. 2.

In this latter topology the substrate is divided into three portions 73, 75 and 74; the portion 75 constitutes external parts of two different transistors of the same type.

This embodiment of the method of obtaining the device according to the invention presents the advantage of using only metals which are well-known and hence easy to use.

All the examples described relate to Darlington amplifiers but the device may also be used for other arrangements comprising two complementary transistors.

What is claimed is:

1. A semiconductor device comprising a semiconductor body having at least first and second bipolar and complementary vertical transistors, each transistor comprising a central base region and two external regions serving as emitter and collector regions, said body comprising a substrate covered by a first epitaxial layer of a first conductivity type on which extends a second epitaxial layer of the second conductivity type opposite to the first, the base region of the first transistor and at least a part of an external region of the second transistor being formed by coplanar portions of the first epitaxial layer, the base region of the second transistor and at least a part of an external region of the first transistor being formed by coplanar portions of the second epitaxial layer and a first portion of the substrate comprising at least a part of the collector region of one of said first and second transistors, an insulating barrier separating entirely at least part of said portions of the second epitaxial layer, characterized in that at least a part of the emitter region of the other transistor comprises a second substrate portion of the opposite conductivity type adjoining and coplanar with, and forming a p-n junction with said first portion, that the insulating barrier extends from the upper surface of said second epitaxial layer down to at least the substrate and that said p-n junction comprises at least a part of a junction which extends from the lower surface of the substrate up to said insulating barrier, and that an electrode is provided on the lower surface of the substrate to connect the first and second substrate portions.

2. A semiconductor device as claimed in claim 1, characterized in that the regions in the substrate are the emitter of the first transistor and a first zone of the collector of the second transistor, while the base of the first transistor and a second zone of the collector of the second transistor comprise portions of the first epitaxial layer, and that the collector of the first transistor and the base of the second transistor comprise portions of the second epitaxial layer, the emitter of the second transistor to comprising a doped zone of the first conductivity type in the second epitaxial layer, the base contact of the first transistor comprising a doped zone of the first conductivity type extending from the upper surface down to a depth exceeding that of the second epitaxial layer.

3. A semiconductor device as claimed in claim 1, characterized in that the regions in the substrate are the collector of the first transistor and a first zone of the emitter of the second transistor, while the base of the first transistor and a second zone of the emitter of the second transistor comprise of the first epitaxial layer, and that the emitter of the first transistor and the base of the second transistor comprise portions of the second epitaxial layer, the collector of the second transistor comprising a doped zone of the first conductivity type in said second epitaxial layer and the base contact region of the first transistor comprising a doped zone of the first conductivity type extending from the upper face down to a depth exceeding the thickness of the second epitaxial layer.

4. A semiconductor device as claimed in claim 2 of the mixed Darlington amplifier type, characterized in that the input transistor comprises said first transistor and the output transistor comprises said second transistor, the collector of the first transistor being connected to the base of the second transistor, an electrode connected to the base of the first transistor comprising the input of the amplifier and the two regions in the substrate connected by said electrode provided on the lower surface of the substrate comprising the amplifier output.

5. A semiconductor device as claimed in claim 3 of the mixed Darlington amplifier type, characterized in that the input transistor comprises said second transistor and the output transistor comprises said first transistor, the collector of the second transistor being connected to the base of the first transistor, an electrode connected to the base of the second transistor comprising the input of the amplifier and the two regions in the substrate connected by said electrode provided on the lower surface of the substrate comprising the amplifier output.

6. A semiconductor device comprising in a same semiconductor body a first mixed Darlington assembly as claimed in claim 4 and a second mixed Darlington assembly differing from said first mixed Darlington assembly in that the regions in the substrate are the collector of the first transistor and a first zone of the emitter of the second transistor, the base of the first transistor and a second zone of the emitter of the second transistor comprise portions of the first epitaxial layer, the emitter of the first transistor and the base of the second transistor comprise portions of the second epitaxial layer, the collector of the second transistor comprises a doped zone of the first conductivity type in said second epitaxial layer, the input transistor comprises said second transistor and the output transistor comprises said first transistors, the collector of the second transistor is connected to the base of the first transistor, and an electrode connected to the base of the second transistor comprises the input of the amplifier, characterized in that the two substrate portions, the two portions of the first epitaxial layer and the two portions of the second epitaxial layer used for the first assembly are respectively coplanar to the two portions of the substrate, the two portions of the first epitaxial layer and the two portions of the second epitaxial layer used for the second assembly, that the regions of the transistors of the first assembly made in said two epitaxial layers are separated from the regions of the transistors of the second assembly made in the two said layers by an insulating barrier extending from the upper surface down to a depth exceeding the thickness of the two said epitaxial layers, that the said four portions of the substrate are connected together by a conductive electrode on the lower surface of the substrate, that said two assemblies comprise an amplifier of the push-pull type in which the inputs are the base of the first transistor of the first assembly and the base of the second transistor of the second assembly and in which the output is the electrode situated on the lower surface of the 7. A semiconductor device as claimed in claim 1, characterized in that said p-n junction situated between the two adjoining portions of the substrate directly terminates at said insulating barrier.

8. A device as claimed in claim 1, characterized in that said insulating barrier separating, in the first epitaxial layer of the first conductivity type, a first portion comprising the base of a transistor of a first type from a second portion constituting a zone of an external region of a transistor which is complementary to the first, contacts said substrate only in the portion thereof which is of the second conductivity type, and that said portion of the substrate projecting from said barrier constitutes with the adjacent extremity of said second portion of the first epitaxial layer a p-n junction which terminates at one of its extremities at said barrier and which, at the other extremity, rejoins the junction situated between the two portions of opposite types of the substrate and constitutes therewith a p-n junction which extends from the lower surface of the substrate up to said insulating barrier.

9. A semiconductor device as claimed in claim 1, characterized in that the insulating barrier substantially comprises a groove which penetrates from the surface of the second layer at least down to the substrate.

10. A device as claimed in claim 9, characterized in that said barrier is locally interrupted and in that the passage thus formed supports a conductive film which forms the connection between an electrode of the first transistor and an electrode of the second transistor.

11. A device as claimed in claim 10, characterized in that the base of said second transistor is insulated from the external region of said first transistor constituted by a portion of the second epitaxial layer by a base contact zone of the first transistor which is homeomorphous to a ring surrounding said external region of said first transistor and extending up to the first epitaxial layer.

12. A device as claimed in claim 10 or 11, characterized in that, on the side of the insulating barrier opposite to that in which the first transistor is formed, an additional insulating barrier substantially parallel to the first separates a narrow and elongate segment from the first epitaxial layer, and that said segment is connected by its first extremity via a connection zone of the passage to the base of the first transistor and by its second extremity to the zone of the external region of the second transistor formed in said first epitaxial layer.

* * * * *

UNITED STATES PATENT OFFICE
CERTIFICATE OF CORRECTION

Patent No. 4,261,002     Dated April 7, 1981

Inventor(s) Bernard Roger

It is certified that error appears in the above-identified patent and that said Letters Patent are hereby corrected as shown below:

Col. 25, Line 40, After "comprise" insert --portions--

Col. 26, Line 3, After "a" (second occurence) delete "same"

Col. 26, Line 41, After "the" (second occurence) insert --substrate.--

*Signed and Sealed this*

*Thirteenth* Day of *October 1981*

[SEAL]

*Attest:*

*Attesting Officer*

GERALD J. MOSSINGHOFF
*Commissioner of Patents and Trademarks*